United States Patent [19]

Hong

[11] 4,241,307

[45] Dec. 23, 1980

[54] MODULE INTERCONNECTION TESTING SCHEME

[75] Inventor: Se June Hong, Poughkeepsie, N.Y.

[73] Assignee: International Business Machines Corporation, Armonk, N.Y.

[21] Appl. No.: 934,936

[22] Filed: Aug. 18, 1978

[51] Int. Cl.$^3$ .................... G01R 31/02; G01R 31/28
[52] U.S. Cl. .................................. 324/73 R; 324/51; 371/25
[58] Field of Search ................. 324/51, 73 R, 73 PC, 324/158 P, 158 F; 235/302.3; 371/15, 21, 24, 25

[56] References Cited

U.S. PATENT DOCUMENTS

| | | | |
|---|---|---|---|
| 3,746,973 | 7/1973 | McMahon | 324/73 R X |
| 3,781,683 | 12/1973 | Freed | 324/73 R X |
| 3,789,205 | 1/1974 | James | 324/73 R X |
| 3,803,483 | 4/1974 | McMahon | 324/51 |
| 3,815,025 | 6/1974 | Jordan | 324/73 R |
| 4,055,754 | 10/1977 | Chesley | 324/73 R X |
| 4,140,967 | 2/1979 | Balasubamanian et al. | 324/73 R |

OTHER PUBLICATIONS

Chao et al., *Online Minimum Probing LSI Testing System*, IBM Tech. Discl. Bulletin, vol. 17, No. 1, Jun. 1974, pp. 152, 153.

Primary Examiner—Gerard R. Strecker
Attorney, Agent, or Firm—James E. Murray

[57] ABSTRACT

This specification describes the testing of interconnections between modules mounted on a card and between the modules and the input and output terminals of the card. Each of the modules has an Exclusive-OR circuit which receives an input from each of the input pins of the module and has a single output which is taken off an output pin of the module. Also, each of the modules has a test input circuit for accessing all of the output pins of the module in parallel from a single input terminal. The test input circuits are used to apply a binary 0 followed by a binary 1 to all the outputs of all the modules. The Exclusive-OR circuits are used to monitor the response to those signals. By testing in this manner, all the connections between the modules and also between the modules and the card terminals can be checked for stuck ones and zeros. In the preferred embodiment a more complex but still relatively simple bit pattern can test all the interconnection nets to determine if there are shorts between any of the nets.

6 Claims, 4 Drawing Figures

MODULE INTERCONNECTION TESTING SCHEME

BACKGROUND OF THE INVENTION

The present invention relates to the testing of connections between modules mounted on cards and more particularly to circuitry in the modules to provide simple testing of such connections.

Before modules are mounted on a card, the modules are each thoroughly tested and the wiring of the card is tested. The faults introduced by the assemblying of the modules on the card generally stem from defective connections to the pins of the modules which do not destroy the internal circuits on the modules. Therefore what really needs to be tested after the assembly of the circuits on the cards is the connections between the modules and the card. However in the past the layout of the modules has been such that this test can not be accomplished without taking into account the already tested circuitry on the module. Since this circuitry is rich in interconnections, generating tests for defective pin connections becomes an enormous task. Speaking more specifically, when the card I/O pins are the only accessible points for testing the test generation process must deal with the whole card full of logic circuits, that is, all the logic circuits on each of the modules mounted on the card. The fact that the fault sites are only at the module boundary, that is, at the pins of the module, does not make the job any easier. Even when the module pins are observable at the card testing one still has to find test inputs that will deliver sensitizing logic values to the module inputs.

In co-pending application Ser. No. 929,480 filed July 31, 1978, and entitled Chip Test Circuitry for Module Final Test a testing method and apparatus is described which could be used to test the connections between the modules and the cards using circuits on the modules in combination with mechanical probing of the cards.

INTRODUCTION

In accordance with the present invention circuitry is provided that permits the testing of interconnections with a very simple electrical test that does not require mechanical probing. Each of the modules has an Exclusive-OR circuit which receives an input from each of the input pins of the module and has a single output which is taken off an output pin of the module. Also, each of the modules has a test input circuit for accessing all of the output pins of the module in parallel. The test input circuits are used to apply a binary 0 followed by a binary 1 to all the outputs of all the modules while the Exclusive-OR outputs are monitored for response to those signals. Doing this checks the connections between the modules and between the modules and the card terminals for stuck ones and zeros. In the preferred embodiment, a more complex but still relatively simple bit pattern can test all the interconnection nets to determine if there are any shorts between the nets.

Therefore it is an object of the present invention to simplify testing of connections between modules mounted on cards after the modules have been so mounted.

It is another object of the invention to simplify the testing of connections between module pins and conductors on the cards.

It is another object to simplify the testing of assemblies where subassemblies have been previously tested.

BRIEF DESCRIPTION OF THE DRAWINGS

These and other objects and advantages of the invention can be understood from the drawings of which.

THE INVENTION

Figure 1:
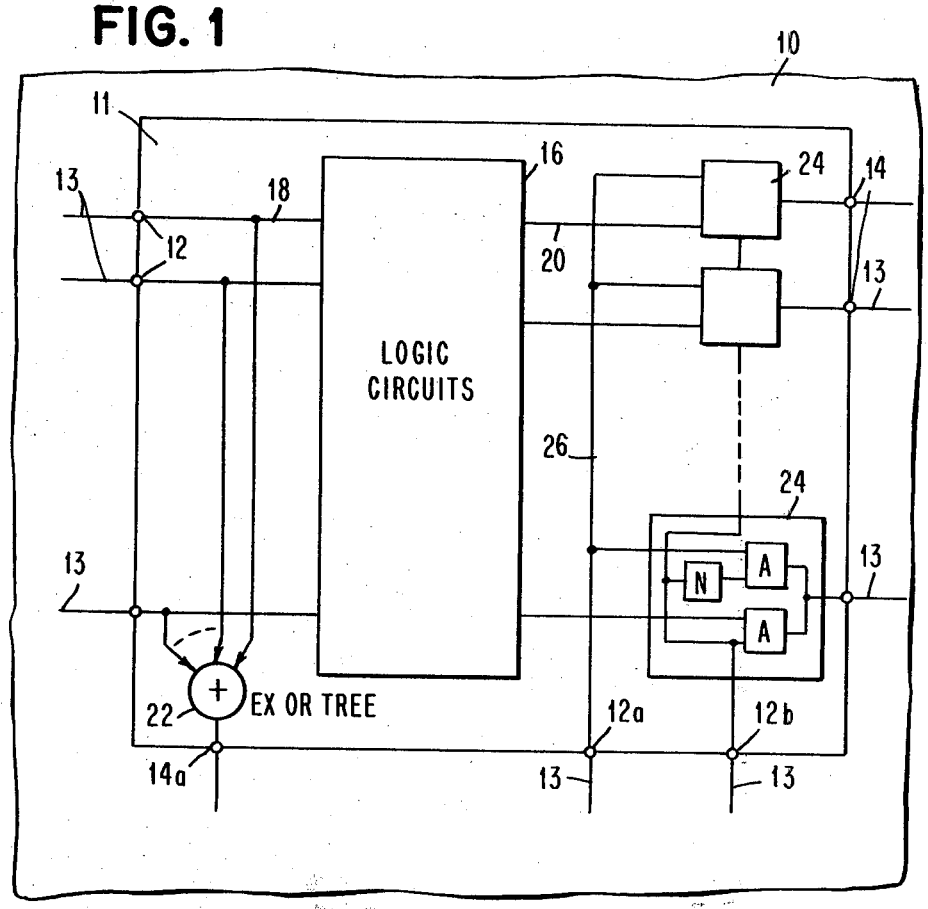
FIG. 1 is a schematic view of a portion of a card embodying a form of the present invention that permits testing of the module pin to card wiring connections without probing the cards or modules.

In the embodiment shown in FIG. 1, each of the modules 11 mounted on the card 10 contains a plurality of both input pins 12 and output pins 14. These pins 12 and 14 are connected by conductors 13 on the card 10 to output and input pins of other modules on the card and to the input and output terminals of the card.

The circuits 16 on each of the modules are connected to the input pins 12 by input lines 18 and the output pins 14 by output lines 21. There are additional circuits provided on each of the modules by this invention. These include an Exclusive-OR tree 22 which receives an input from each of the input pins 12 and has a single output which is taken off the module on pin 14a. Furthermore, each output line 21 is connected through a half-select circuit 24 to the output pins 14 of the module. The half-select circuits have two inputs. One of the inputs is from one of the output lines 21. The other input is from line 26 connected to input pin 12a. The outputs of the select circuits each go to one of the output pins 14 while the control terminals for each of the circuits is connected to input pin 12b.

The card must have 2 plus number of modules additional input and output terminals to perform tests in accordance with the present invention and each module must have three additional input and output pins as contemplated by the embodiment shown in FIG. 1.

During normal operation, that is, operation when the modules are not being tested, a binary 1 is applied to each of the terminals 12b. This connects the output lines 21 of the logic circuits to the output terminals 14 so the circuits 16 on the cards can perform in their intended manner. When the circuits are to be tested a binary 0 is applied to terminals 12b on all the modules. This ungates the connection between the output lines 21 of the original logic circuits and the terminals and instead connects all the terminals to line 26 so that test signals can be applied to the output terminals by their application to the card terminal connected to terminals 12a on all the modules. The test signals are a binary 0 followed by a binary 1. The first signal tests for any pin stuck at 1. If the card tests good, a binary 0 will appear at the card terminal connected to module terminals 14a, if not a binary 1 appears at this terminal.

The second signal tests for any pin stuck at binary 0. If the card tests good a binary 1 will appear in response to the test, while a bad card will produce a binary 0 in response thereto. This would give an indication as to where the bad connection occurred.

Figure 2:
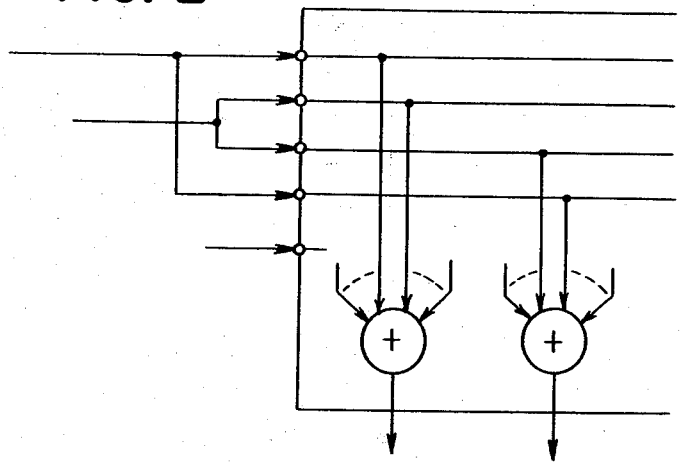
FIG. 2 is a schematic view of a portion of a card showing a modification to be made in the embodiment of FIG. 1 when two input pins of a module are connected to a single input line.

In making the above test two presumptions were made. One is that there are an odd number of inputs to each card. The other is that one source does not go to two inputs on a single module. If the first presumption is not true for any module 11 a dummy input can be provided to the Exclusive-OR circuit of that module from an additional input pin. If the second presumption is not true, the problem can be overcome by the modification shown in FIG. 2.

A simple embodiment of the invention has been described above. What follows is a description of a more complex embodiment which permits testing for shorts between the different interconnection networks on the card in addition to testing for simple stuck 1's or 0's in those networks. This eliminates the need for a card wiring test.

Figure 3:
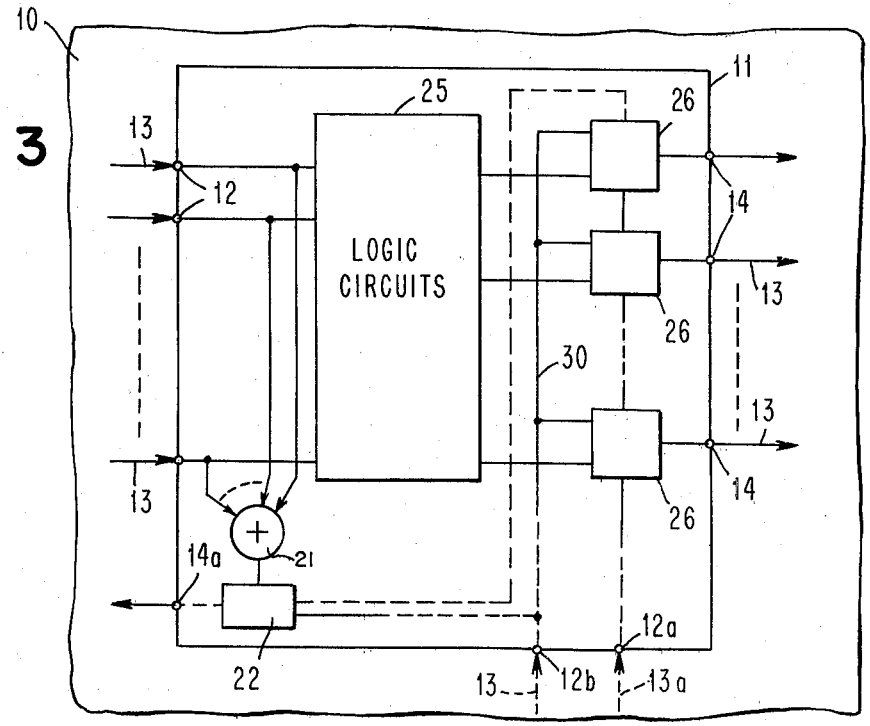
FIG. 3 is a schematic view of a portion of a card showing a form of the invention which permits the testing of interconnection nets on the cards along with the connections between the module pins and the card wiring.

As shown in FIG. 3, each module includes an Exclusive-OR circuit 22 with an input coupled to each of the module input pins 12 and output connected to a stage 22 in a shift register of the type described in U.S. Pat. No. 3,993,919. In addition the output pins 14 are each connected to a stage 26 of the same shift register. Data can be loaded into the first stage of this shift register at input terminal 12a, stepped through all stages of the shift register with clock signals and removed from the last stage of the shift register at output terminal 14a. Data can also enter all shift register stages in parallel from the logic circuits 25 and from the output of the Exclusive-OR tree 21.

How data is entered into the shift register is determined by the timing, set and reset signals described in the last mentioned patent and represented symbolically by line 30 coupled in input terminal 12b. Thus the stages 26 could each be loaded with a "1" or a "0" through terminal 12a while the shift register is in serial mode, thereafter the shift register could be changed to parallel data mode and the response of Exclusive-OR tree captured in stage 22 and then the shift register could be returned to serial data mode to read the response in stage 22 out of terminal 14a. This process can be repeated any number of times so that a whole series of bits can be loaded into each of the stages and each time the stages are loaded the response of the Exclusive-OR tree 22 can be taken off the module.

The shift registers of all the modules 11 on the card can be arranged in series and data shifted through all shift registers. If the shift registers are arranged in series only one input terminal and one output terminal of the card are needed for all the shift registers. If the shift registers are not so arranged a separate set of input and output terminals are needed for each shift register.

To use the circuitry shown in FIG. 3 to check the interconnections on the card for shorts between the nets the number of separate interconnecting nets on the card must be determined.

The number of nets on the card is equal to the number of source pins for the nets which include all the module output pins and the card primary input pins. Let us say there are N nets on a card. Typically the number of nets is less than 1000. The number of tests, n, for the comprehensive method can be given as $$n \leq [1 + \log_2 N] \text{ for } N > 2$$

This works as follows:
(i) To test every pin stuck at 0 and 1, each net should have at least one 0 value and at least one 1 value in the test.
(ii) When two nets short together, the value of one dominates the other, therefore any net that may short (adjacent somewhere in the card) must have at least one opposing value pair in the test.
(iii) If the Exclusive-OR output value is observed not through a shift register, but through a separate pin, the test inputs arriving at each module must have at least one odd parity case and at least one even parity case to test the stuck faults of the Exclusive-OR output pin itself.

A simple approach to (i) and (ii) is to assign to each net a unique non-zero binary ID of length $1 + \log_2 N$. When each source produces its own ID, all single stuck or short faults are sensitized through at least one Exclusive-OR gate.

The total number of tests required in this method is already very small, however, if not all nets can short, one can derive a shorter test by non-unique ID assignment, i.e., the nets that never cross or parallel each other can have the same ID. This kind of analysis is probably not very important in a practical sense. The general method of doing this can be summarized as:
(1) Construct compatibility table of non-adjacent nets,
(2) generate minimal number, k, of covering compatibles,
(3) assign $1 + \log_2 k$ bit long non-zero unique ID's to the compatibles.

The condition (iii) for testing the Exclusive-OR output pin, if necessary, can be satisfied easily by a simple trial and error process as follows:
(1) Check all module inputs to see if there at least one even parity input and one odd parity input in the tests,
(2) if some modules have test inputs entirely of the same parity, permute some ID's one at a time and check again.

Figure 4:
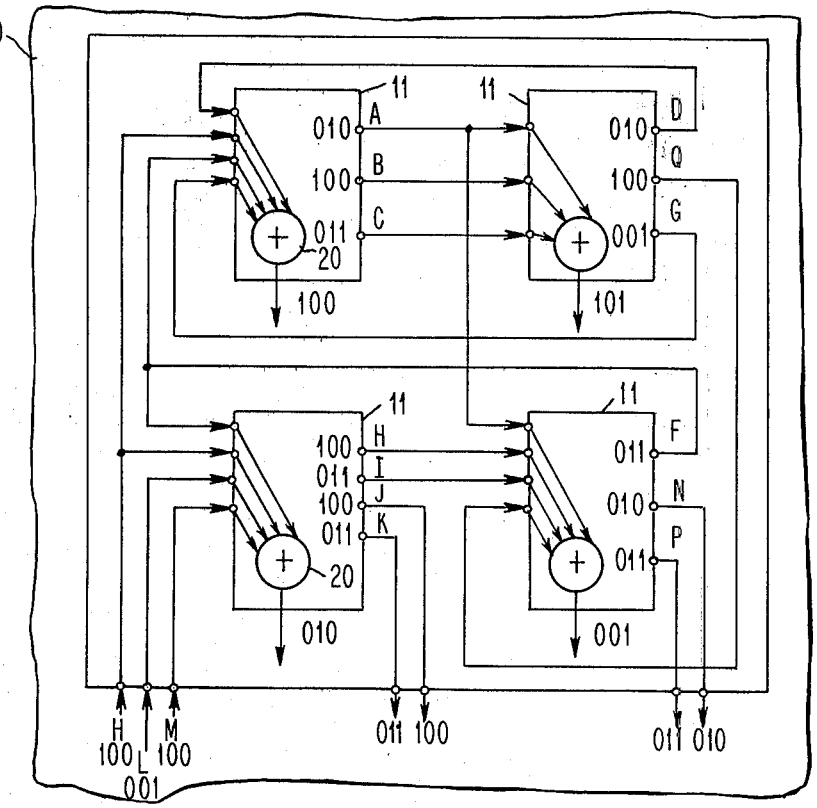
FIG. 4 is a schematic view of a card containing the embodiment of FIG. 3 with test signals superimposed on the terminals and pins of the card.

The above juggling produces good assignments in a few trials. An example of reduced tests for module pins and card wiring is shown in FIG. 4 and the following table.

| INCOMPATIBILITY TABLE | |
|---|---|
| NET | ADJACENT TO |
| A | B C F G H |
| B | A C |
| C | A B |
| D | E F |
| E | D F L |
| F | A D E G N |
| G | A F Q |
| H | A I |
| I | H J Q |
| J | I K |
| K | J |
| L | E M |
| M | L |
| N | F P Q |
| P | N Q |
| Q | D F G I N P |

One minimal covering compatibles has 4 compatibles as follows:

| {G,L}, assigned ID | {A,D,N} | {C,F,I,K,L,P} | {B,E,H,J,M,Q} |
|---|---|---|---|
| 001 | 010 | 011 | 100 |

The card in FIG. 4 has three input terminals and there are a total of 13 output pins on the modules of the card. Therefore there is a total of 16 nets on the card. However as can be seen by the above analysis three test are all that is needed when non-adjacent nets are excluded. Two embodiments of an invention have been described. Both embodiments dealth with modules mounted on a card. However, it should be understood that the invention could be applied to chips mounted on modules or to any subassembly-assembly combination. Therefore, it should be understood that this and other changes can be made in the two disclosed embodiments without departing from the spirit and scope of the invention.

Having thus described my invention, what I claim as new, and desire to secure by Letters Patent is:

1. In an electronic circuit package in which a plurality of subassembly circuit packages with logic circuitry thereon are mounted on a insulative base with an interconnecting network for interconnecting the input and output terminals of the subassembly circuit packages with each other and with terminals of the electronic circuit package the improvement comprising:
   a separate Exclusive-OR circuit tree means included in each of the subassembly circuit packages, which is connected to the input terminals of that subassembly circuit package in which it is included to test connections to output terminals of the subassembly packages;
   half select input circuit means on each of subassembly packages for coupling the output terminals of the subassembly packages to a test input terminal of the subassembly package for application of test signals to the output terminals of the subassembly packages while the output of said logic circuits are ungated from said output terminals and;
   circuit means on said base for activating said masking circuits and supplying said test signals to the test input terminals of said subassembly packages whereby the network of the electronic circuit package can be tested with simple binary signal combinations.

2. The electronic circuit package of claim 1 including control terminal means on each of said subassembly packages for controlling the masking and testing circuit means.

3. The electronic circuit package of claim 2 wherein the masking and testing circuits are a plurality of shift register stages in which each stage of the shift register is coupled to one of the output terminals of the subassembly packages whereby a sequence of signals can be applied to the output terminals by shifting them one after another to the output stages.

4. The electronic circuit package of claim 3 wherein said circuit means on said base includes means for the simultaneous application of different input signal combinations to different output terminals of said subassembly whereby shorts between different interconnection networks in the assembly can be detected.

5. The electronic circuit package of claim 2 wherein said masking and test input circuit means is a plurality of half-select circuits each with its output connected to one of the output terminals of the subassembly and one input connected to an output line of the logic circuits and the other input connected to the test input terminal of the subassembly package and a control terminal connected to the control terminal means of the subassembly package.

6. The electronic circuit package of claim 5 wherein said circuit means on said base couples all the test output terminals of the subassembly packages together to an output pin of the electronic circuit package and connects all the test input terminals of the subassembly packages together to an input pin of the test package and connects all the control terminals of the subassembly packages together to a control pin of said electronic circuit package whereby all the interconnection networks can be tested for opens and shorts by application of a single binary 0 and a single binary 1 to the single test input pin while monitoring the single output test pin.

* * * * *